(12) United States Patent
Kim et al.

(10) Patent No.: US 12,267,087 B2
(45) Date of Patent: Apr. 1, 2025

(54) METHOD FOR GENERATING BURST ERROR CORRECTION CODE, DEVICE FOR GENERATING BURST ERROR CORRECTION CODE, AND RECORDING MEDIUM STORING INSTRUCTIONS TO PERFORM METHOD FOR GENERATING BURST ERROR CORRECTION CODE

(71) Applicant: Research & Business Foundation SUNGKYUNKWAN UNIVERSITY, Suwon-si (KR)

(72) Inventors: Sang-Hyo Kim, Suwon-si (KR); Dong Geun Lee, Suwon-si (KR); Jungrae Kim, Suwon-si (KR); Seokin Hong, Suwon-si (KR); DongHyun Kong, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 49 days.

(21) Appl. No.: 18/090,632

(22) Filed: Dec. 29, 2022

(65) Prior Publication Data

US 2023/0216525 A1    Jul. 6, 2023

(30) Foreign Application Priority Data

Dec. 30, 2021    (KR) .................. 10-2021-0192961

(51) Int. Cl.
*H03M 13/00*     (2006.01)
*H03M 13/09*     (2006.01)
*H03M 13/17*     (2006.01)
*H03M 13/27*     (2006.01)

(52) U.S. Cl.
CPC ......... *H03M 13/17* (2013.01); *H03M 13/098* (2013.01); *H03M 13/2735* (2013.01)

(58) Field of Classification Search
None
See application file for complete search history.

(56) References Cited

U.S. PATENT DOCUMENTS

| | | | | |
|---|---|---|---|---|
| 5,381,423 | A * | 1/1995 | Turco .................. | H03M 13/175 714/761 |
| 5,517,508 | A * | 5/1996 | Scott ..................... | H04L 1/0009 714/776 |
| 5,657,331 | A * | 8/1997 | Metzner ................ | H03M 13/17 714/761 |
| 8,448,051 | B2 * | 5/2013 | Toda ..................... | H03M 13/15 714/787 |
| 11,190,209 | B2 * | 11/2021 | Blaum ............... | H03M 13/2906 |

(Continued)

*Primary Examiner* — Mujtaba M Chaudry
(74) *Attorney, Agent, or Firm* — NSIP Law

(57) ABSTRACT

There is provided a method for generating a burst error correction code. The method comprises: setting a mother code; defining a syndrome set corresponding to each burst error pattern for at least two burst error patterns to be corrected based on the mother code; shortening a column of a PCM (parity check matrix) of the mother code so that the defined syndrome sets are relatively prime; and designing an error correction code for the each burst error pattern based on an optimal generator polynomial maximizing a length of the shortened code within a range of a length of a parity bit of the mother code or a syndrome vector included in the syndrome set that is relatively prime.

20 Claims, 6 Drawing Sheets

(56) References Cited

U.S. PATENT DOCUMENTS

| | | | |
|---|---|---|---|
| 11,474,898 B2* | 10/2022 | Blaum | H03M 13/293 |
| 2011/0239091 A1* | 9/2011 | Toda | H03M 13/152 |
| | | | 714/E11.041 |
| 2013/0191696 A1* | 7/2013 | Roberts | H03M 13/2906 |
| | | | 714/755 |
| 2015/0155967 A1* | 6/2015 | Kim | H04L 1/0058 |
| | | | 375/295 |
| 2019/0042358 A1* | 2/2019 | Criss | G06F 11/1048 |
| 2019/0081730 A1* | 3/2019 | Oveis Gharan | H03M 13/6312 |
| 2019/0250985 A1* | 8/2019 | Seo | G06F 11/1068 |
| 2022/0190846 A1* | 6/2022 | Imel | H03M 13/1174 |

* cited by examiner

METHOD FOR GENERATING BURST ERROR CORRECTION CODE, DEVICE FOR GENERATING BURST ERROR CORRECTION CODE, AND RECORDING MEDIUM STORING INSTRUCTIONS TO PERFORM METHOD FOR GENERATING BURST ERROR CORRECTION CODE

This work was supported by Institute of Information & communications Technology Planning & Evaluation IITP grant funded by Korea government MSIT (Project unique No.: 1711134594; Project No.: 2021-0-00863-001; Government department: Ministry of Science and ICT; R&D management Agency: Institute of Information & communications Technology Planning & Evaluation; Research Project Title: Development of intelligent In-Memory error correction device for high reliability memory; and Project period: 2021.04.01-2021.12.31).

CROSS-REFERENCE TO RELATED APPLICATIONS

This application claims the benefit under 35 USC § 119(a) of Korean Patent Application No. 10-2021-0192961, filed on Dec. 30, 2021, at the Korean Intellectual Property Office, the entire disclosure of which is incorporated herein by reference for all purposes.

TECHNICAL FIELD

The present disclosure relates to a burst error correction code generation technique, and more particularly, to a method and device for generating a code for correcting an error in a semiconductor memory device.

BACKGROUND

Semiconductor memory devices may be classified into non-volatile memory devices such as flash memory devices and volatile memory devices such as DRAMs. In volatile memories such as DRAM (Dynamic random access memory) and SRAM (Static random access memory), the SER (soft error rate) of CMOS (Complementary Metal Oxide Semiconductor), which is more highly integrated and driven with low power, is on the rise.

Since most of the existing errors occurred with a 1-bit error, a code having a SEC (single error correction) characteristic that minimizes space and delay overhead was used.

However, in an environment where the occurrence rate of MCU (multi-cell upset) increases, a code capable of correcting multiple errors using additional parity is required. BCH/RS (Bose-Chaudhuri-Hocquenghem/Reed-Solomon) codes may be used as codes for correcting multiple errors. However, due to the characteristics of memory, a long length in parity results in large space and delay overhead. To improve the aforementioned issue, a code that corrects a specific error pattern that occurs relatively frequently without correcting all patterns of multiple errors has been proposed.

As a result of studying the pattern of multiple errors, it was identified that soft errors occur intensively in physically close cells.

Accordingly, an SEC-DED-DAEC (Single error correction-double error detection-double adjacent error correction) code and an SEC-DED-TAEC (Single error correction double error detection-triple adjacent error correction) that correct multiple errors occurring between adjacent cells have been proposed. These memory error correction codes are designed to have high reliability by correcting adjacent errors while having less parity than BCH/RS codes.

Most of the memory error correction codes utilize codes based on binary linear block codes, and have been developed from Hamming SEC codes in 1950 to Hsiao's SEC-DED codes in 1970 and Dutta's SEC-DED-DAEC codes in 2007.

The presently proposed techniques design codes in such a way as to search for codes that satisfy certain conditions. Since this method basically designs each given parameter, the search complexity increases rapidly as the data length increases.

SUMMARY

In order to address an issue associated with the related art, it is necessary to design an error correction code that has low complexity and enables a flexible design for various message lengths.

A technical task of the present disclosure is to provide a burst error correction code generation method and device for designing a code for correcting an error in a semiconductor memory device as a flexible and low-complexity code for various message lengths.

The aspects of the present disclosure are not limited to those mentioned above, and other aspects not mentioned herein will be clearly understood by those skilled in the art from the following description.

In accordance with an aspect of the present disclosure, there is provided a method for generating a burst error correction code. The method comprises: setting a mother code; defining a syndrome set corresponding to each burst error pattern for at least two burst error patterns to be corrected based on the mother code; shortening a code by shortening a column of a PCM (parity check matrix) of the mother code so that the defined syndrome sets are relatively prime; and designing an error correction code for the each burst error pattern based on an optimal generator polynomial maximizing a length of the shortened code within a range of a length of a parity bit of the mother code or a syndrome vector included in the syndrome set that is relatively prime.

The at least two burst error patterns are at least two of a single bit error and a Q bit adjacent error (Q is a natural number).

The shortening the code may include reducing a message length of the mother code by a predetermined length $l_s$.

The mother code is provided with a Hamming code using an attribute of a cyclic code, and the Hamming code has a generator polynomial obtained based on a primitive polynomial of a Galois field, and when the length of the parity bit is m, a field is the Galois field.

The shortening the code may include: determining a maximum code length of a short code satisfying a condition that the syndrome sets do not overlap by gradually selecting the column of the PCM of the mother code; and determining a maximum message length by subtracting the length of the parity bit from the maximum code length.

Wherein in order to obtain a code capable of correcting all the burst error patterns, a minimum value of the maximum code length is decided as a maximum short code length.

The determining of the maximum code length is configured to select columns in order from a leftmost column of the mother code and stop before overlap between the syndrome sets occurs.

The determining the maximum code length may include: sorting syndrome exponents, which are starting points of the syndrome set, in ascending order, and then setting the syndrome sets not being overlapped the syndrome exponents in the syndrome sets using a difference between values of the syndrome exponents, and calculating the maximum code length that allows the burst error pattern to be corrected.

The determining the maximum code length may include determining an optimal generator polynomial maximizing a maximum shortened length based on the generator polynomial within a range of the length m of the parity bit.

The determining the optimal generator polynomial, when the generator polynomial is converted and expressed in hexadecimal by the length of the parity bit m, a range capable of being used as the generator polynomial is as shown in Equation 1 below:

$$2^m+1<[g(x)]<2^{m+1} \qquad \text{<Equation 1>}$$

wherein a maximum value of the maximum code length of a code generated by the generator polynomial within the range is defined, and the generator polynomial for generating the code having a maximum value of the maximum message length is set to the optimal generator polynomial, wherein g(x) indicates the generator polynomial, [g(x)] indicates the range capable of being used as the generator polynomial, and m indicates the length of the parity bit.

The designing of the error correction code for the each burst error pattern may include: determining the optimal generator polynomial maximizing the length of the shortened code within the range of the length of the parity bit of the mother code; calculating a maximum message length by subtracting the length of the parity bit from a maximum code length of the shortened code; determining a target message length by subtracting the length of the parity bit from a target code length shortened by a shortened length bit; and designing the error correction code that satisfies the target message length based on the optimal generator polynomial.

The shortening the column of the PCM of the mother code may include: determining a maximum code length of a short code satisfying a condition that the syndrome sets do not overlap by gradually selecting a column of the PCM of the mother code; and determining a maximum message length by subtracting the length of the parity bit from the maximum code length.

The determining the maximum code length is configured to determine the optimal generator polynomial maximizing a maximum shortened length based on the generator polynomial.

Wherein in the determining the optimal generator polynomial, when the generator polynomial is expressed in hexadecimal by the length of the parity bit m, a range capable of being used as the generator polynomial is as shown in Equation 2 below:

$$2^m+1<[g(x)]<2^{m+1} \qquad \text{<Equation 2>}$$

wherein a maximum value of the maximum code length of a code generated by the generator polynomial within the range is defined, and the generator polynomial for generating the code having a maximum value of the maximum message length is set to the optimal generator polynomial, wherein g(x) indicates the generator polynomial, [g(x)] indicates the range capable of being used as the generator polynomial, and m indicates the length of the parity bit.

In accordance with another aspect of the present disclosure, there is provided a device for generating a burst error correction code. The apparatus comprises: a memory; a communication unit configured to communicate with the memory; and a control unit. The control unit is configured to: set a mother code for correcting errors in the memory, define a syndrome set corresponding to each burst error pattern for at least two burst error patterns to be corrected based on the mother code, shorten a code by shortening a column of a parity check matrix PCM of the mother code so that the defined syndrome sets are relatively prime, and design an error correction code for the each burst error pattern based on an optimal generator polynomial maximizing a length of the shortened code within a range of a length of a parity bit of the mother code or a syndrome vector included in the syndrome set.

The control unit is configured to reduce a message length of the mother code by a predetermined length $l_s$ in order to shorten the column of the PCM.

Wherein the mother code is provided with a Hamming code using an attribute of a cyclic code; and the Hamming code has a generator polynomial obtained based on a primitive polynomial of a Galois field, and when the length of the parity bit is m, a field is the Galois field.

The control unit is configured to: determine the optimal generator polynomial maximizing the length of the shortened code within the range of the length of the parity bit of the mother code; calculate a maximum message length by subtracting the length of the parity bit from a maximum code length of the shortened code; determine a target message length by subtracting the length of the parity bit from a target code length shortened by a shortened length ($l_s$ bit); and design the error correction code that satisfies the target message length based on the optimal generator polynomial.

In accordance with another aspect of the present disclosure, there is provided a non-transitory computer-readable storage medium including computer executable instructions, wherein the instructions, when executed by a processor, cause the processor to perform a method for generating a burst error correction code. The method comprises: setting a mother code; defining a syndrome set corresponding to each burst error pattern for at least two burst error patterns to be corrected based on the mother code; shortening a code by shortening a column of a parity check matrix PCM of the mother code so that the defined syndrome sets are relatively prime; and designing an error correction code for the each burst error pattern based on an optimal generator polynomial maximizing a length of the shortened code within a range of a length of a parity bit of the mother code or a syndrome vector included in the syndrome set.

The designing of the error correction code for the each burst error pattern may include: determining the optimal generator polynomial maximizing the length of the shortened code within the range of the length of the parity bit of the mother code; calculating a maximum message length by subtracting the length of the parity bit from a maximum code length of the shortened code; determining a target message length by subtracting the length of the parity bit from a target code length shortened by a shortened length bit; and designing the error correction code that satisfies the target message length based on the optimal generator polynomial.

According to an embodiment of the present disclosure, by providing a method for generating a burst error correction code, a computer readable recording medium, a computer program and a device, a code for correcting an error in a semiconductor memory device can be designed as a flexible and low-complexity code for various message lengths.

The benefits of the present disclosure are not limited to those mentioned above, and other benefits not mentioned herein will be clearly understood by those skilled in the art from the following description.

DETAILED DESCRIPTION

Figure 1:
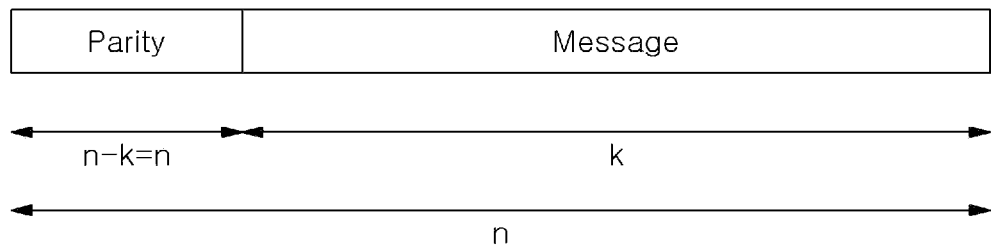
FIG. 1 is a diagram illustrating the structure of (n, k) block codes.

The advantages and features of the embodiments and the methods of accomplishing the embodiments will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Terms used in the present specification will be briefly described, and the present disclosure will be described in detail.

In terms used in the present disclosure, general terms currently as widely used as possible while considering functions in the present disclosure are used. However, the terms may vary according to the intention or precedent of a technician working in the field, the emergence of new technologies, and the like. In addition, in certain cases, there are terms arbitrarily selected by the applicant, and in this case, the meaning of the terms will be described in detail in the description of the corresponding invention. Therefore, the terms used in the present disclosure should be defined based on the meaning of the terms and the overall contents of the present disclosure, not just the name of the terms.

When it is described that a part in the overall specification "includes" a certain component, this means that other components may be further included instead of excluding other components unless specifically stated to the contrary.

In addition, a term such as a "unit" or a "portion" used in the specification means a software component or a hardware component such as FPGA or ASIC, and the "unit" or the "portion" performs a certain role. However, the "unit" or the "portion" is not limited to software or hardware. The "portion" or the "unit" may be configured to be in an addressable storage medium, or may be configured to reproduce one or more processors. Thus, as an example, the "unit" or the "portion" includes components (such as software components, object-oriented software components, class components, and task components), processes, functions, properties, procedures, subroutines, segments of program code, drivers, firmware, microcode, circuits, data, database, data structures, tables, arrays, and variables. The functions provided in the components and "unit" may be combined into a smaller number of components and "units" or may be further divided into additional components and "units".

Hereinafter, the embodiment of the present disclosure will be described in detail with reference to the accompanying drawings so that those of ordinary skill in the art may easily implement the present disclosure. In the drawings, portions not related to the description are omitted in order to clearly describe the present disclosure.

A memory error correction code (hereinafter referred to as ECC) according to an embodiment of the present disclosure is designed as a code that increases reliability by utilizing only short-length parity bits in consideration of limited space and delay overhead.

As the degree of memory integration increases, the number of cases in which multiple errors occur increases. Conventionally, BCH/RS codes exist as codes for correcting multiple errors, but these codes have a disadvantage in that space and delay overhead increase as the length of the parity bit increases.

Accordingly, in an embodiment of the present disclosure, a code capable of selectively correcting only specific error patterns is designed.

In particular, there is described a method of designing a code that corrects multiple errors occurring in adjacent cells using the characteristic that the probability of soft errors occurring in physically adjacent cells increases, and designing a code capable of selectively correcting a specific pattern when specific error patterns occur in clusters.

In an embodiment of the present disclosure, a relatively low complexity code design utilizing a structure of a cyclic code, rather than a high complexity search-based code design, is proposed among candidates satisfying conditions.

In particular, there is proposed a method of designing a PCM using the properties of a cyclic code designed based on a finite field rather than a simple column selection method.

According to the number and type of error patterns, codes that guarantee all error class corrections may be flexibly generated, and codes may be designed with low complexity for the target message length and all lengths.

Hereinafter, a basic concept of a burst error correction code generation method according to an embodiment of the present disclosure will be first described for convenience of understanding prior to the description of specific contents related to the present disclosure.

Linear Block Code

Memory semiconductors require low-latency and high-reliability error correction codes for fast data processing. Since most existing memories have an error of 1 bit or less, developed codes based on Hamming codes having SEC characteristics have been used. A hamming code is the first error correction code proposed in 1950 and is a linear block code that may correct 1-bit error.

An embodiment of the present disclosure is intended to be described based on binary block codes.

A block code is configured of a set of codewords having a fixed length of bits.

A block code of n bits in length is configured of k bits for a fixed length message and m(m=n−k) bits for parity. The m may be n−k. In this connection, the ratio between the codeword and the message bit length is called a code rate.

FIG. 1 illustrates the structure of an (n, k) block code. The (n, k) block code defines and uses only $2^k$ numbers of codewords in a vector space of $2^n$ numbers of points of length n. As a result, it is possible to secure a hamming distance between codewords, and the interstellar arrangement of these codewords enables errors occurring in channel or memory read/write operations to be corrected.

System Model

Figure 2:
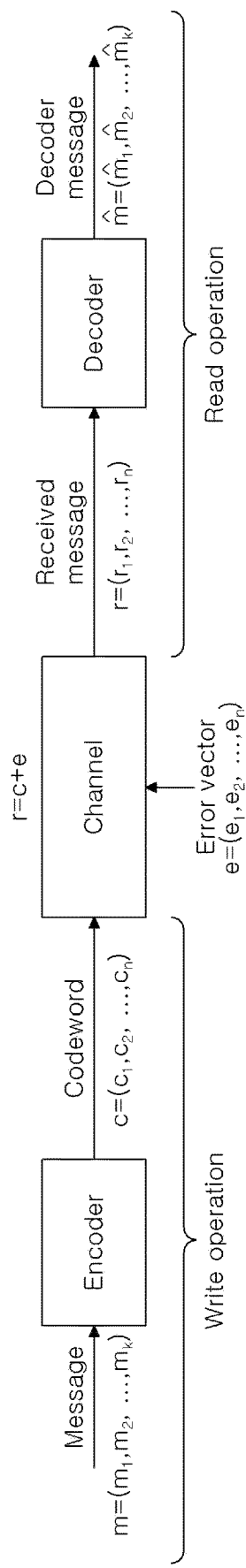
FIG. 2 is a diagram illustrating a general channel model of a block code.
Figure 3:
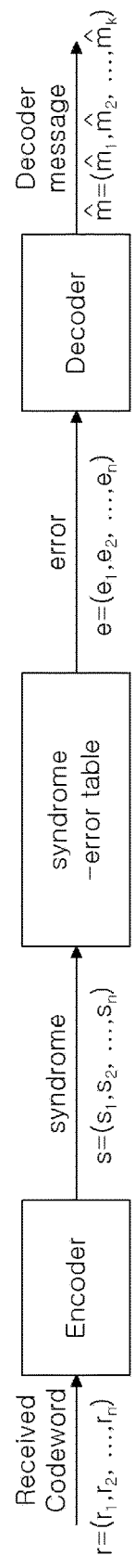
FIG. 3 is a block diagram illustrating a decoding process of a received signal.

FIG. 2 illustrates a general channel model of a block code. During a write operation of data in DRAM, m-bit parity is generated and stored from a k-bit message through an encoding process, and during a read operation, a k-bit message is obtained through a decoding process from an n-bit received signal. In the encoding process, an n-bit codeword is stored by multiplying a message vector with a generator matrix G-matrix, and in the decoding process, a syndrome vector is obtained by multiplying a received codeword with a PCM H-matrix. Accordingly, error detection and correction are possible.

Generator Matrix

Block codes are encoded using a generator matrix. A systematic code is a code in which a message is included in a codeword, and a generator matrix is configured of a k×(n−k) parity matrix P and a k×k unit matrix $I_k$ as shown in Equation 1 below.

$$G=[P:I_k] \qquad \text{<Equation 1>}$$

ECC codes for DRAM are all implemented as systematic codes. The size of the generator matrix is k×n, and when a k-bit message vector m is input, an n-bit codeword vector c is output.

A block code based on a cyclic code may express a generator matrix using a generator polynomial of the cyclic code. In the case of Hamming, BCH, and RS codes, a generator matrix and PCM may be expressed using the generator polynomial of the cyclic code with the cyclic code defined by utilizing the properties of a Galois field. Wherein the Galois field may be finite field. Hamming codes are defined by introducing a primitive polynomial of the finite field as the generator polynomial. A binary field of size $2^n$ has a number of primitive polynomials, and Hamming codes with different structures are generated according to the selection of primitive polynomials.

Parity Check Matrix (PCM)

PCM is a matrix that discriminates whether a vector to be checked is a codeword, and is utilized to detect or correct errors in a decoding process. The structure of the PCM of the systematic code is as shown in Equation 2 below.

$$H=[I_{n-k}:P^T] \qquad \text{<Equation 2>}$$

The PCM has a size of (n−k)×n and is configured of a (n−k)×(n−k) unit matrix $I_{n-k}$ and a parity matrix P. $cH^T=0$ is satisfied for any codeword. In addition, given the structure of the matrix, the generator matrix and the PCM satisfy the relationship as shown in Equation 3 below.

$$GH^T=0 \qquad \text{<Equation 3>}$$

In the decoding process, an (n−k) bit vector obtained by multiplying a received codeword vector r having a length of n bits by PCM is called a syndrome s. The syndrome vector is calculated as shown in Equation 4 below.

$$s=rH^T=(c+e)\cdot H^T=eH^T \qquad \text{<Equation 4>}$$

It may be understood that the syndrome vector has nothing to do with the transmitted codeword and is determined only by the error vector e. When the syndrome vector is 0, it means that no error has occurred or an error corresponding to the codeword has rarely occurred. When the syndrome vector is not 0, it means that an error has occurred. Accordingly, the presence or absence of an error may be detected using the syndrome value.

Since the syndrome is determined only by the error pattern e, it may also be utilized to detect and correct error patterns with a high probability of occurrence. A column vector of PCM becomes a syndrome value when a single error occurs at the corresponding location. Accordingly, the location of a single error may be inferred through the syndrome and error correction is possible.

When the column vectors of the PCM overlap, a syndrome may be shared between single errors and miscorrection may occur. Accordingly, the column vectors of the PCM are configured so that the binary parity vector patterns do not overlap. In the case of the Hamming code, every column of the PCM is configured differently, and every single error may be corrected.

When the corresponding finite field is $F_{2^m}$ and the primitive element is expressed as α, the PCM of the Hamming code defined as a cyclic code may be expressed as shown in Equation 5 below.

$$H=[1\,\alpha\,\alpha^2 \ldots \alpha^{2^m-2}] \qquad \text{<Equation 5>}$$

Since the Hamming code has parameters of (n, k)=($2^m-1$, $2^m-1-m$), the size of H is (n−k)×n. This PCM is equivalent to a binary matrix expressed by converting each column into an additive form representation of the elements of the field. For example, PCM of (7, 4) Hamming code may be expressed in two ways as shown in Equation 6 below.

$$H = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix} = [1\ \alpha\ \alpha^2\ \alpha^3\ \ldots\ \alpha^6] \qquad \text{(Equation 6)}$$

The generator polynomial corresponding to this example is $g(x)=x^3+x+1$. When the syndrome vector is $s=\alpha^3=1+a$, the error may be corrected assuming that a single error occurs in the third bit of the codeword.

Definition of Burst Error Pattern Set $E_h$ and Burst Error Pattern $e_h$

First, the error pattern is clearly defined. Because the error pattern has the property of a cyclic shift, even when the starting point of the error pattern is arbitrarily set, the parameter of the code is the same. In order to set the standard of the starting point of the error pattern, an error burst is first defined.

Assume that a binary sequence in which the starting and ending points of an error pattern are 1 is an error burst. For example, '1' is a unique error burst of length 1, '11' is a unique error burst of length 2, and error bursts of length 3 are '101' and '111'. An error burst made of consecutive 1s is called an adjacent error, and '11', '111', and '1111' are examples. Since a single burst error pattern is of primary interest in an embodiment of the present disclosure, an error pattern that includes an error burst is used. In this connection, an error pattern in which the error burst starts from the first symbol is defined as a representative burst error pattern, and is displayed as $e_b$. For example, a representative burst error pattern for example error bursts (1), (11), and (101) is given as shown in Equation 7 below.

$$e_{(1)}=(100 \ldots 000)$$

$$e_{(11)}=(1100 \ldots 000)$$

$$e_{(101)}=(10100 \ldots 000) \qquad \text{<Equation 7>}$$

A cyclic shift of the burst error pattern yields single burst error patterns that include a given error burst. Among the burst error patterns, a burst completely within the codeword is called a non all-around (NAA, acyclic) burst, and a burst that starts before the codeword boundary and ends past the codeword boundary is called an all-around (AA, cyclic)

burst. The representative burst error pattern described in the above Equation 7 is an example of a NAA burst pattern. For example, an AA burst error pattern of a 4-bit adjacent error burst b=(1111) is shown in Equation 8 below.

$$e=(110\ldots011) \quad \text{<Equation 8>}$$

When a set of single burst error patterns including the same error burst pattern b is defined, only the NAA burst error pattern may be considered, or the AA burst error pattern may be included. First, for error burst b, an NAA burst error pattern group considering only the NAA burst error is defined as shown in Equation 9 below.

$$E_b=\{T^i e_b | i \in [0, n-l_b]\} \quad \text{<Equation 9>}$$

Wherein, $l_b$ means the length of error burst b. For example, $l_{(101)}$ means that the length of error burst is 3. In addition, T is an operation of a cyclic shift of the error pattern by 1 and is defined as shown in Equation 10 below.

$$Te=T(e_0, e_1, \ldots, e_{n-1})=(e_{n-1}, e_0, e_1, \ldots, e_{n-2}) \quad \text{<Equation 10>}$$

Wherein, $T^i$ means an operation that applies T i times. In this connection, the size of the burst error pattern group is $|E_b|=n-l_b+1$. The AA burst error pattern may be added to define an AA burst error pattern group as shown in Equation 11 below.

$$\overline{E_b}=\{T^i e_b | i \in [0, n-l_b]\} \quad \text{<Equation 11>}$$

The size of the group of the AA burst error pattern $|\overline{E_b}|$ becomes n regardless of the length of b. In an embodiment of the present disclosure, the NAA burst error pattern group is basically considered. In addition, it is desired to expand on the results for the AA burst error pattern.

Various adjacent error and burst error correction ECCs may be well defined based on their correction capability for $E_b$. The concept of an adjacent error correction code may be defined as follows.

Definition 1: Codes that may correct $E_{(1)}$ are called SEC codes.

Definition 2: Codes that may correct $\{E_b | b=(1), (11), \ldots,$ all one burst of length l$\}$ are called l-AEC codes.

Among the l-AEC codes, when l=2, it may also be called a DAEC code, when l=3, it may be called a TAEC code, and when l=4, it may be called a QAEC code. For the sake of notational efficiency, the l-AEC property is considered to include the capability to correct adjacent error bursts shorter than l. In other words, the DAEC property means correcting both $E_{(1)}$ and $E_{(11)}$. A 2-bit error burst only exists in (11), so DAEC is equivalent to a 2-bit burst EC. The l-bit burst EC may be defined recursively as follows.

Definition 3: A code that satisfies the following conditions is called an l-bit burst EC code.

a) The code has (l−1)-bit burst EC properties.
b) $\{E_b | b$ such that the length of b=l$\}$ may be corrected.

For example, a 3-bit burst EC code is a code that corrects all sets of burst error groups $\{E_{(1)}, E_{(11)}, E_{(101)}, E_{(111)}\}$.

Definition of Set of Indices V and Indices $v_i$ where Burst Error Pattern Appears Assume that the primitive-circle of g(x) in GF($2^m$) generated by the primitive polynomial g(x) is α. The elements of GF($2^m$) may be expressed as powers of α. In the case of element $x=\alpha^i$ of GF($2^m$), the function that returns the exponent of α is defined as shown in Equation 12 below.

$$i=\log_\alpha x \quad \text{<Equation 12>}$$

When there is an error burst b, $e_b$ becomes a representative burst error pattern. Assume that the syndrome therefor is s. The s is defined as shown in Equation 13 below.

$$s=He_b^T \quad \text{<Equation 13>}$$

In this connection, when the exponent of the square expression of α of the syndrome value is v, the relationship between α and v is defined as shown in Equation 14 below.

$$v=\log_\alpha s \quad \text{<Equation 14>}$$

This will be called a syndrome exponent. Since the exponent v is a function of the error burst b, it is expressed as $v_b$ when necessary for clarity of expression.

A set $V=\{v_i\}$ having syndrome exponents for the burst error pattern $B=\{b_i\}$ to be corrected as elements may be obtained. (Where $v_i$ is a simplified representation of $v_{b_i}$.)

For example, the DAEC code corrects error patterns for error burst $B=\{b_1=(1), b_2=(11)\}$. The syndromes of the representative burst error patterns $e_{(1)}, e_{(11)}$ are $s_1=1, s_2=1+\alpha$, respectively, and the two syndrome exponents may be obtained as shown in Equation 15 below.

$$v_1=\log_\alpha 1=0$$

$$v_2=\log_\alpha(1+\alpha) \quad \text{<Equation 15>}$$

Herein, $v_2$ is determined by field operation according to the generator polynomial g(x) of the finite field. The size of the syndrome set that each error pattern maximally includes without overlapping may be obtained using a difference between the syndrome exponents, and the maximum codeword length may be calculated therefrom. The syndrome exponent v has a different value depending on the number of parity bits m and the generator polynomial g(x). Accordingly, an algorithm for obtaining the maximum code length in a given g(x) and an algorithm for obtaining an optimal generator polynomial g*(x) for obtaining the maximum code length among possible g(x) within a given range of m will be described later.

Definition of Entire Syndrome Set S and Syndrome Set $S_i$ Corresponding to Burst Error Group In the existing Hamming code, all syndrome values except 0 correspond to a single error to have the property of SEC. In an embodiment of the present disclosure, a code is designed so that a specific error pattern may be corrected by using code shortening to correspond an unused syndrome to a specific error pattern. First, in the case of a shortened or punctured Hamming code, since the PCM of a mother code does not have the same column, the syndrome does not overlap between single bit errors. For $B=\{b_i\}$ defined above, the syndrome set of the i-th burst error group $E_{b_i}$ is defined as $S_i=\{He^T | e \in E_{b_i}\}$. In this connection, the syndrome set $S_i$ is a subset of the syndrome set S. When $S_i$ satisfies the condition shown in Equation 16 below, it has burst error correction capability corresponding to B.

$$S_i \cap S_j = \emptyset, \ (i \neq j | i, j \in \{1, 2, \ldots, n_b\}) \quad \text{<Equation 16>}$$

In the above, $n_b$ is the number |B| of error bursts b to be corrected.

An $n_s(<n)$ indicates the code length which is assumed. For example, in order to satisfy the DAEC property, when $He_{(1)}=\alpha^{v_1}$, $He_{(11)}=\alpha^{v_2}$, the syndrome corresponding to each burst error group $E_{(1)}, E_{(11)}$ is given as shown in Equation 17 below.

$$S_1=\{\alpha^{v_1}, \alpha^{v_1+1}, \alpha^{v_1+2}, \ldots, \alpha^{v_1+n_s-1}\}$$

$$S_2=\{\alpha^{v_2}, \alpha^{v_2+1}, \alpha^{v_2+2}, \ldots, \alpha^{v_2+n_s-2}\} \quad \text{<Equation 17>}$$

In this connection, $S_1 \cap S_2 = \emptyset$ needs to be satisfied. Depending on the relative values of the shortened code lengths $n_s$ and $v_1, v_2$, the condition $S_1 \cap S_2 = \emptyset$ may not be satisfied. In this connection, the DAEC code may be designed by increasing the degree of shortening.

Hereinafter, PCM of a code that flexibly corresponds to various message lengths according to an embodiment of the present disclosure will be described.

An embodiment of the present disclosure describes a low-complexity code design using a structure of a cyclic code, rather than a high-complexity search-based code design among candidates satisfying conditions.

In particular, a method for designing a PCM using properties of a circuit code designed based on a finite field rather than a simple column selection method is described. According to the number and type of error patterns, codes that guarantee all error class corrections may be flexibly generated, and codes may be designed with low complexity for the target message length and all lengths.

<Code Design Using Shortening Technique>

Figure 4:
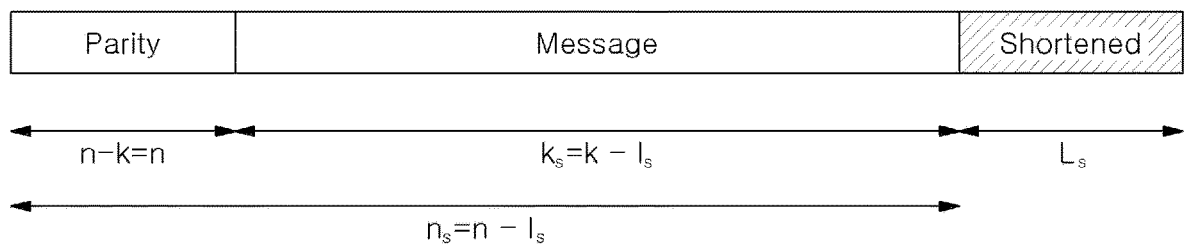
FIG. 4 illustrates the structure of a block code using a shortening technique according to an embodiment of the present disclosure.

Code shortening is a technique for modifying linear block codes that adjusts a code rate by deleting some spaces corresponding to the message portion in the systematic code. Assume that the linear code (n, k) is a mother code and the shortened length is $l_s$. The parameters of the modified short code are given as $(n_s, k_s)=(n-l_s, k-l_s)$. This shortening process is illustrated in FIG. 4.

In an embodiment of the present disclosure, the Hamming code is shortened to have desired burst error properties. The length of the Hamming mother code generated based on the finite field $GF(2^m)$ and the number of PCM columns are $2^m-1$. In this connection, since the length of the syndrome vector is m, a total of $2^m-1$ 1-bit errors may be corrected only when all $2^m-1$ syndromes except 0 are used. Herein, the syndrome for the error pattern in which only the i-th bit is 1 becomes the i-th column of H, and syndrome-based error correction may be performed according to this mapping.

In order to perform error correction for two or more burst patterns without increasing the length of the parity bit or the size of a finite field that is the basis of the mother code, the size of the syndrome set for each burst error group needs to be reduced. This may be achieved through code shortening by deleting the columns of the PCM.

In an embodiment of the present disclosure, the PCM of the systematic code with the message portion arranged on the right side is considered. Even when oppositely arranged, the subject matter of the present disclosure may be realized through the same process. Code shortening is performed by sequentially deleting as many columns as necessary from the right side in order to maintain systematic code characteristics.

Assume that syndrome S is a set of all binary vectors of all lengths m except 0. In addition, assume that set $S_1$ is defined as a syndrome set for a single error. When the length of the parity bit m is decided, $S_1$ of the shortened code is configured of PCM columns corresponding to the shortened code.

In other words, when $|S_1|=n_s$, syndrome values belonging to $S-S_1$ may be used to correct other errors.

Herein, the syndrome set for 2-bit adjacent errors to be corrected is $S_2$. When $S_1$ and $S_2$ are relatively prime through sufficient shortening, the short code and further shortened codes will be codes that may correct single errors and 2-bit adjacent errors.

In addition, when more types of burst error patterns are to be corrected, syndrome sets corresponding to each are defined, and shortened so as not to intersect. However, as the number of errors to be corrected increases, the length of the shortened code will be relatively short.

To explain again, the number of PCM columns of the Hamming mother code is $2^m-1$. In this connection, in order to correct a 1-bit error, correction is possible only when all non-zero syndromes are used. In order to perform error correction for two or more burst patterns without increasing the size of the corresponding finite field or the parity, the size of the syndrome set for each class needs to be reduced, which may be achieved through code shortening. Code shortening may be achieved by deleting the columns of the PCM.

In an embodiment of the present disclosure, code shortening is basically executed by sequentially deleting as many columns as necessary from the right side of the PCM.

The technique of shortening the code is a method of reducing the length of the message by $l_s$ bits, and transforming the same into a code having parameters of $(n_s, k_s)=(n-l_s, k-l_s)$.

Syndrome subset $S_1$ that satisfies single error correction SEC is taken as PCM and the remaining portions are continuously shortened. In other words, by shortening the portion except for the syndrome subset $S_1$ for SEC in PCM H, it is possible to design a code capable of correcting defined error patterns without overlapping syndromes with respect to other error patterns.

FIG. 4 illustrates the structure of a block code using a shortening technique according to an embodiment of the present disclosure.

In this connection, the size of the total syndrome set is maintained, but since the length is reduced, the size of the single error syndrome set $S_1$ is reduced, and the syndromes corresponding to $S-S_1$ may be used to correct other errors.

The example above is a case of trying to correct two classes of burst errors, a single bit error and an adjacent 2-bit error. When more types of burst error patterns are to be corrected, a syndrome set corresponding to each is defined. When they are relatively prime, all burst error patterns may be corrected.

<Generation of Hamming Code-Based Burst Error Correction Code Using Attributes of Cyclic Codes>

In an embodiment of the present disclosure, a single burst error correction code is designed by shortening a binary hamming code having a length of $2^m-1$.

In order to utilize the properties of cyclic codes in design, primitive systematic Hamming codes are basically considered. The (n, k) primitive binary Hamming code is a code that has a primitive polynomial that generates a Galois field $GF(2^m)$ as a generator polynomial. When a is a primitive element of $GF(2^m)$, the parity check matrix PCM may be expressed based on the elements of $GF(2^m)$ as shown in Equation 18 below.

$$H=[1\,\alpha\,\alpha^2\,\ldots\,\alpha^{2^m-2}] \quad \text{<Equation 18>}$$

When the elements of the fields of the above matrix are expressed in the form of addition, in other words, polynomials of degree m-1 of α, and the coefficients are expressed as binary vectors, $m\times(2^m-1)$ binary PCM is obtained, which corresponds to the general PCM of binary Hamming codes. In the above PCM form, the syndrome $s=Hr^T$ is given as an element of $GF(2^m)$, which is also equivalent to a syndrome vector of length m when using binary matrix representation.

Because of this type of PCM, the $i(\in\{0, 1, \ldots, 2^m-2\})$-th single-bit error syndrome becomes $\alpha^i$. A syndrome set for a burst error pattern group, S, is a set of field elements (continuous powers of S). Accordingly, it is easy to check whether the syndromes for the burst error group overlap. Accordingly, by adjusting the amount of shortening, it is possible to make the syndromes corresponding to the desired burst error group not overlap each other. In this connection, it is possible to have correction capabilities for burst error groups for several predetermined burst patterns in addition to a single error. Error patterns with a high probability of occurrence may exist depending on memory physical properties or structural characteristics, and representative examples are double-adjacent errors and triple-adjacent errors. When it is not possible to configure a code with a desired length for a given m in this way, it may be tried to increase the length of the mother code by increasing m.

In order to systematically proceed with such code shortening, first, a mother code is presented and a short code of the maximum length satisfying a condition that the syndrome does not overlap is configured by gradually selecting the columns of the PCM.

Utilizing this method, it is possible to make a code with the maximum length that satisfies the characteristics of DAEC, TAEC, QAEC, and burst EC for given m and $GF(2^m)$.

Hereinafter, a method for selecting a maximum short code length $n_{max}$, a method for selecting an optimal generator polynomial $g^*(x)$, and a method for obtaining the length of the parity bit (m) and a generator polynomial $g(x)$ when given a target message length $k_{target}$ will be explained.

<Selection of Maximum Short Code length $n_{max}$ for Generator Polynomial $g(x)$>

As already mentioned, the code used in an embodiment of the present disclosure is an iterative code having a primitive polynomial of a Galois field as a generator polynomial, and is a primitive Hamming code. When the length of the code and message is reduced using the shortening technique, syndromes correcting the corresponding message bit positions are not used and may be used to correct other error patterns.

Accordingly, by shortening the Hamming mother code that satisfies the existing SEC, the syndromes without a corresponding single error are intended to be corrected by corresponding to multiple error patterns.

First, a field $GF(2^m)$ defined by the primitive polynomial $g(x)$ is assumed. In this connection, a Hamming mother code of length $2^m-1$ is defined. When the field is generated, a set of burst errors to be corrected is set. The set of burst errors may be expressed as Equation 19 below.

$$B=\{b_i | 1 \le i \le n_b\} \quad \text{<Equation 19>}$$

Herein, $n_b$ is the number of error burst patterns to be corrected and $b_i$ is the i-th error burst. For the error burst set B, a code having single burst error correction performance may be designed through shortening.

According to the calculation attributes of the field $GF(2^m)$ made of the generator polynomial $g(x)$, the maximum length of the short code that satisfies a desired error correction attribute may be obtained. When the short code is decided, single burst error groups $E_i$ corresponding to each burst pattern are defined, and syndrome sets $S_i$ for these error groups are also decided.

Herein, a short code with the maximum length that satisfies the error correction property for a given mother code may be found in two ways. A technique of selecting columns in order from a leftmost column of the first mother code and stopping before overlap between syndrome sets occurs may be used. Another method is to find the minimum shortening amount in which the syndrome sets do not overlap while increasing the shortening amount starting from the mother code in a reverse direction. Since both methods provide the same result, an embodiment of the present disclosure provides the first method as Algorithm 1.

Algorithm 1 that selects the maximum short code length $n_{max}$ using the defined parameters is proposed. The generator polynomial $g(x)$ defines the i-th error burst $b_i$ and the representative burst error pattern $e_{b_i}$ to be repaired in a given situation. Assume that the syndrome exponent corresponding to the syndrome for the representative burst error pattern $e_{b_i}$ in the generated field is $v_i$.

In order to design the proposed code such that the syndromes correcting each error pattern do not overlap, after sorting syndrome exponents $v_i$, which are starting points of the syndrome set $S_i$, in ascending order, using a difference between values of the syndrome exponents, the maximum code length that allows $E_{b_i}$ to be corrected is calculated by setting such that the syndrome exponents of $S_i$ do not overlap. First, when the syndrome exponents are sorted in ascending order and then indexed in order, the condition shown in Equation 20 below is satisfied.

$$v'_a \le v'_b (\text{if } a < b) \quad \text{<Equation 20>}$$

When the permutation of the corresponding index is defined as $\pi(\cdot)$, $v'_j = v_{\pi(j)}$ is satisfied.

After being sorted in ascending order, the difference in values between adjacent syndrome exponents decides the maximum size of a set of consecutive non-overlapping syndromes using Equation 21 below.

$$|S_{\pi(j)}| \le v'_{j+1} - v'_j \quad \text{<Equation 21>}$$

Since the size of the syndrome set varies according to the length of the error burst, the maximum code length $n_j$ for correcting $E_{\pi(j)}$ may be obtained by adding $l_b - 1$ to $v'_{j+1} - v'_j$. To obtain a code capable of correcting all burst error groups, the minimum value of $n_j$ needs to be decided as the maximum short code length $n_{max}$. The maximum message length $k_{max}$ may be obtained by subtracting the length of the parity bit m from the maximum short code length $n_{max}$. The syndrome set $S_i$ for the i-th burst error group $E_{b_i}$ will be expressed as shown in Equation 22 below and becomes a set which is relatively prime.

$$S_i = \{\alpha^{v_i}, \alpha^{v_i+1}, \ldots, \alpha^{v_i + n_{max} - l_{b_i}}\}, \quad \text{<Equation 22>}$$

For example, the syndrome exponent for the burst error pattern $e_{b_1} = e_{(1)} = (100 \ldots 000)$ for SEC $v_1 = 0$ and the corresponding syndrome set has $S_1 = \{\alpha^0, \alpha^1, \ldots, \alpha^{n_{max}-1}\}$. In this connection, the shortening length from the right becomes $2^m - 1 - n_{max}$. For the generator polynomial $g(x)$, the maximum short code length $n_{max}$, maximum message length $k_{max}$, and shortened bit length $l_s$ may be obtained through Algorithm 1 as shown in Table 1 below.

TABLE 1

Algorithm 1: Selection of Maximum Short Code Length $n_{max}$ for Generator Polynomial $g(x)$ 0: Input: $g(x)$, m
1: Output: $k_{max}$, $n_{max}$
2: (Define) $b_i \in B$, $e_{b_i} \in E$, $v_i \in V$
3: Get $v_j'$ by sorting $v_i$ in increasing order ($i = \pi(j)$): $(v_j' = v_{\pi(j)})$
4: $v_{n_b+1}' \leftarrow 2^m - 1$
5: $n_j \leftarrow v_{j+1}' - v_j' + 1_{b_{\pi(j)}} - 1$, $j \in [1, n_b]$
6: $n_{max} \leftarrow \min(n_j)$, $j \in [1, n_b]$
7: $k_{max} \leftarrow n_{max} - m$ Example 1: When the given length of the parity bit m is 5 and the generator polynomial $g(x)$ of $GF(2^m)$ is $x^5 + x^3 + 1$, it is intended to design a DAEC code considering only the NAA adjacent error pattern based on the Hamming short code. The maximum short code length $n_{max}$ of this code may be obtained using Algorithm 1. As mentioned, the DAEC code has burst error correction capability for two error burst patterns B={(1), (11)}. There are given burst error patterns $e_{b_1}=e_{(1)}=(1000 \ldots 000)$ and $e_{b_2}=e_{(11)}=(110 \ldots 000)$, and burst error groups $\{E_{(1)}, E_{(11)}\}$. Next, the exponential index $v_i$ of the primitive-element $\alpha$ corresponding to the product of the burst error pattern group and the PCM are found. Table 2 below shows a field generated by g(x), and shows an example of selecting a field and index $v_i$ generated by $g(x)=x^5+x^3+1$.

TABLE 2

| $v_i$ | $\alpha^{v_i}$ | $GF(2^5)$ |
|---|---|---|
| 0 | 1 | =1 |
| 1 | $\alpha$ | $=\alpha$ |
| 2 | $\alpha^2$ | $=\alpha^2$ |
| 3 | $\alpha^3$ | $=\alpha^3$ |
| 4 | $\alpha^4$ | $=\alpha^4$ |
| 5 | $\alpha^5$ | $=\alpha^3+1$ |
| 6 | $\alpha^6$ | $=\alpha^4+\alpha$ |
| 7 | $\alpha^7$ | $=\alpha^3+\alpha^2+1$ |
| 8 | $\alpha^8$ | $=\alpha^4+\alpha^3+\alpha$ |
| 9 | $\alpha^9$ | $=\alpha^4+\alpha^3+\alpha^2+1$ |
| 10 | $\alpha^{10}$ | $=\alpha^4+\alpha+1$ |
| 11 | $\alpha^{11}$ | $=\alpha^3+\alpha^2+\alpha+1$ |
| 12 | $\alpha^{12}$ | $=\alpha^4+\alpha^3+\alpha^2+\alpha$ |
| 13 | $\alpha^{13}$ | $=\alpha^4+\alpha^2+1$ |
| 14 | $\alpha^{14}$ | $=\alpha+1$ |
| 15 | $\alpha^{15}$ | $=\alpha^2+\alpha$ |
| 16 | $\alpha^{16}$ | $=\alpha^3+\alpha^2$ |
| 17 | $\alpha^{17}$ | $=\alpha^4+\alpha^3$ |
| 18 | $\alpha^{18}$ | $=\alpha^4+\alpha^3+1$ |
| 19 | $\alpha^{19}$ | $=\alpha^4+\alpha^3+\alpha+1$ |
| 20 | $\alpha^{20}$ | $=\alpha^4+\alpha^3+\alpha^2+\alpha+1$ |
| 21 | $\alpha^{21}$ | $=\alpha^4+\alpha^2+\alpha+1$ |
| 22 | $\alpha^{22}$ | $=\alpha^2+\alpha+1$ |
| 23 | $\alpha^{23}$ | $=\alpha^3+\alpha^2+\alpha$ |
| 24 | $\alpha^{24}$ | $=\alpha^4+\alpha^3+\alpha^2$ |
| 25 | $\alpha^{25}$ | $=\alpha^4+1$ |
| 26 | $\alpha^{26}$ | $=\alpha^3+\alpha+1$ |
| 27 | $\alpha^{27}$ | $=\alpha^4+\alpha^2+\alpha$ |
| 28 | $\alpha^{28}$ | $=\alpha^2+1$ |
| 29 | $\alpha^{29}$ | $=\alpha^3+\alpha$ |
| 30 | $\alpha^{30}$ | $=\alpha^4+\alpha^2$ |

The exponential index $v_i$ of the primitive-element $\alpha$ corresponding to the product of the burst error pattern $e_{b_i}$ and the PCM may obtain $v_1=0$, $v_2=14$, respectively. Then, the syndrome set is filled by adding the index by 1 to the syndrome set $S_i$ of each burst error pattern as shown in Equation 23 below. Then, when overlapped with other burst error syndrome sets, the maximum short code length $n_{max}$ may be obtained.

$$S_1=\{\alpha^0,\alpha^1,\alpha^2,\alpha^3,\alpha^4,\alpha^5,\alpha^6,\alpha^7,\alpha^8,\alpha^9,\alpha^{10},\alpha^{11},\alpha^{12},\alpha^{13}\}$$

$$S_2=\{\alpha^{14},\alpha^{15},\alpha^{16},\alpha^{17},\alpha^{18},\alpha^{19},\alpha^{20},\alpha^{21},\alpha^{22},\alpha^{23},\alpha^{24},\alpha^{25},\alpha^{26}\}$$ <Equation 23>

The maximum short code length $n_{max}$ generated in the example above is 14, the maximum message length $k_{max}$ is 9, and the number of shortened bits ($l_s$) is 17. The PCM generated in the example is expressed as shown in Equation 24 below.

$$H = \begin{bmatrix} 1 & 0 & 0 & 0 & 0 & 1 & 0 & 1 & 0 & 1 & 1 & 1 & 0 & 1 \\ 0 & 1 & 0 & 0 & 0 & 0 & 1 & 0 & 1 & 0 & 1 & 1 & 1 & 0 \\ 0 & 0 & 1 & 0 & 0 & 0 & 0 & 1 & 0 & 1 & 0 & 1 & 1 & 1 \\ 0 & 0 & 0 & 1 & 0 & 1 & 0 & 1 & 1 & 1 & 0 & 1 & 1 & 0 \\ 0 & 0 & 0 & 0 & 1 & 0 & 1 & 0 & 1 & 1 & 1 & 0 & 1 & 1 \end{bmatrix}$$ <Equation 24>

<Selection of Optimal Generator Polynomial (g*(x))>

The maximum short code length $n_{max}$ and the maximum message length $k_{max}$ may be obtained for $GF(2^m)$ made of the given length of the parity bit m and the given primitive polynomial g(x) through Algorithm 1 described above.

Upon reviewing the result of this algorithm 1, the length of the shorted code that satisfies the burst error correction condition varies depending on the values of $v_i$, which are exponents of $S_i$, which are syndromes of representative error patterns.

However, since the calculation structure of $GF(2^m)$ varies depending on the primitive polynomials that generate the field, primitive polynomials of the corresponding degree may be tried.

In an embodiment of the present disclosure, the optimal g*(x) that maximizes the maximum short axis length is found through a search of the primitive polynomial g(x). This process is described in Algorithm 2 as shown in Table 3 below.

Algorithm 2 finds g(x) that maximizes the short code length $n_s$ within the range of lengths of the parity bit m, which is called the optimal generator polynomial g*(x). First, given the length of the parity bit m, the range and type of primitive polynomial g(x) that may be used are determined. When converting g(x) into an integer (represented in hexadecimal) such as $[g(x)]=\Sigma g_k 2^k$, the range is as shown in Equation 25 below.

$$2^m+1 \leq [g(x)] < 2^{m+1}$$ <Equation 25>

Among the maximum short code lengths $n_{max}$ of codes generated by primitive polynomials within the range, the maximum value is defined as $n^*_{max}$. In this connection, the generator polynomial of the code having the maximum value $n^*_{max}$ of the maximum message length is called the optimal generator polynomial g*(x).

Algorithm 2: Selection of Optimal Generator
Polynomial g*(x) from Given Length of Parity Bit 0: Input: m
1: Output: g*(x)
2: $2^m + 1 \leq [g(x)] < 2^{m+1}$
3: $n_{max}$ obained by Algorithm 1

4: $n^*_{max} \leftarrow \max_{g(x)} n_{max}$

5: $Selcet\ g^*(x) \leftarrow \arg\max_{g(x) \in G} n^*_{max}$

Example 2: When a DAEC code is designed based on a Hamming short code with the given length of the parity bit m is 5 and the primitive polynomial g(x) within the range of $GF(2^m)$, the range of $g(x)_{16}$ is $21 \leq g(x)_{16} \leq 40$. In the table 3 below, n'$_{max}$ is 14, so $g^*(x)_{16}$ may select 25 and 29. Accordingly, through Algorithm 2, it is possible to select g*(x) that generates a code with the longest length within the range of lengths of the parity bit. Table 4 below shows an example of selecting an optimal generator polynomial g*(x) when the range of lengths of the parity bit m is 5.

TABLE 4

| $g(x)_{16}$ | polynomial | $v_2$ | $n_{max}$ |
|---|---|---|---|
| 25 | $x^5 + x^2 + 1$ | 18 | 14 |
| 29 | $x^5 + x^3 + 1$ | 14 | 14 |
| 2F | $x^5 + x^3 + x^2 + x + 1$ | 12 | 12 |

TABLE 4-continued

| $g(x)_{16}$ | polynomial | $v_2$ | $n_{max}$ |
|---|---|---|---|
| 37 | $x^5 + x^4 + x^2 + x + 1$ | 19 | 13 |
| 3B | $x^5 + x^4 + x^3 + x + 1$ | 13 | 13 |
| 3D | $x^5 + x^4 + x^3 + x^2 + 1$ | 20 | 12 |

<Code Design that Satisfies Target Message Length $k_{target}$>

Through the previous section, the maximum message length $k_{max}$ for each length of the parity bit m was obtained. Using the same, a method of designing a code that satisfies the target message length $k_{target}$ based on Table 5 below through a shortening technique is presented. The target message length $k_{target}$ may be obtained by subtracting the length of the parity bit m from the target code length $n_{target}$ shortened by $1_s$ bits. When the target code length $n_{target}$ is greater than the maximum short code length $n_{max}$, a larger mother code is used. Among cases where the target code length $n_{target}$ is smaller than the maximum short code length $n_{max}$, the minimum length of the parity bit is selected, and the optimal generator polynomial $g^*(x)$ is selected using Algorithm 2.

TABLE 5

Algorithm 3: Code Design that Satisfies Target Message Length $k_{target}$

0: Input: $k_{target}$
 1: Output: m, $g^*(x)$, $n_{target}$
 2: Find arg $\min_{m}(k_{max} > k_{target})$
 3: $g^*(x)$ obtained by Algoritm2
 4. $n_{target} \leftarrow k_{target} + m$ Example 3: When a DAEC code with a target message length $k_{target}$ of 128 is designed, a minimum value of the length of the parity bit with a maximum message length longer than the target message length may be obtained through Algorithm 1. Alternatively, the value may be easily obtained through a pre-calculated table. When the length of the parity bit is 9, the maximum message length $k_{max}$ is 249, and satisfies the condition of $k_{max} > k_{target}$. In this connection, the optimal generator polynomial $g^*(x)$ of the code has $x^9+x^8+x^5+x^4+x^3+x+1$. Accordingly, the code length $n_{target}$ is 137, the shortened bit length $1_s$ is 374, and the code rate is $$R = \frac{128}{137}.$$

Hereinafter, a method for selecting a generator polynomial and the length of the parity bit will be described as an example.

Example of Method for Selecting Generator Polynomial and Length of Parity Bit
(Case 1) Method for Selecting g(x) and Maximum Code Length of TAEC Code Example 4: A TAEC code with a target message length $k_{target}$ of 128 is to be designed. In the case of a single error correction-triple adjacent error correction TAEC code, the number of corrected burst error patterns $n_b$ is 3, and the burst error pattern set is as shown in Equation 26 below.

$$\varepsilon = \{E_{b_1}, E_{b_2}, E_{b_3}\} = \{E_{(1)}, E_{(11)}, E_{(111)}\} \qquad \text{<Equation 26>}$$

The set of indices V in which each error pattern appears may be obtained by referring to a pre-calculated table. The minimum length of the parity bit m that may have the target message length through Algorithm 3 is 10, and $g^*(x)=x^{10}+x^9+x^8+x^6+x^4+x^2+1$ is used as a generator polynomial. In this connection, the index for the error pattern is as shown in Equation 27 below.

$$v_1=0, v_2=277, v_3=631 \qquad \text{<Equation 27>}$$

Continuous power elements of $\alpha$ are added to each burst error syndrome set $S_i$ as shown in Equation 28 below. The target code length $n_{target}$ is 138, which is a value obtained by adding the length of the parity bit m to the target message length $k_{target}$.

$$S_1=\{\alpha^0,\alpha^1,\alpha^2,\ldots,\alpha^{137}\}$$

$$S_2=\{\alpha^{277},\alpha^{278},\alpha^{279},\ldots,\alpha^{413}\}$$

$$S_3=\{\alpha^{631},\alpha^{632},\alpha^{633},\ldots,\alpha^{766}\} \qquad \text{<Equation 28>}$$

In this connection, PCM H has elements of $S_1$ as column vectors. The designed code has TAEC characteristics and parameters of $(n_{target}, k_{target})=(138, 128)$.

(Case 2) Method for Selecting g(x) and Maximum Code Length of Code when Error Patterns are Added The proposed code may be designed and expanded flexibly according to the error burst set B to be corrected. The error burst set B needs to be defined, the index set V and the syndrome set S need to be found using Algorithm 1, and the message with the maximum length or the target length needs to be found. By adding an error pattern to the TAEC code of the previous example, a code having QAEC or 3-bit burst EC characteristics may be designed.

Example 5: When a QAEC code with a target message length $k_{target}$ of 128 is designed, the number of error bursts $n_b$ is 4 and the set of error patterns is as shown in Equation 29 below.

$$E=\{E_{b_1},E_{b_2},E_{b_3},E_{b_4}\}=\{E_{(1)},E_{(11)},E_{(111)},E_{(1111)}\} \qquad \text{<Equation 29>}$$

According to Algorithm 3, the minimum length of the parity bit m that may have the target message length is 10, and the generator polynomial is $g^*(x)=x^{10}+x^8+x^6+x^4+x^2+x+1$. For the burst error pattern defined above, a set of syndrome exponent $V=\{v_1, v_2, v_3, v_4\}$ may be calculated. The index $v_i$ for the burst error pattern is as shown in Equation 30 below.

$$v_1=0, v_2=747, v_3=394, v_4=195 \qquad \text{<Equation 30>}$$

Each syndrome set $S_i$ is sequentially updated by the size of the burst error pattern set based on the index as shown in Equation 31 below.

$$S_1=\{\alpha^0,\alpha^1,\alpha^2,\ldots,\alpha^{137}\}$$

$$S_2=\{\alpha^{747},\alpha^{748},\alpha^{749},\ldots,\alpha^{883}\}$$

$$S_3=\{\alpha^{394},\alpha^{395},\alpha^{396},\ldots,\alpha^{529}\}$$

$$S_4=\{\alpha^{195},\alpha^{196},\alpha^{197},\ldots,\alpha^{329}\} \qquad \text{<Equation 31>}$$

Accordingly, it is possible to obtain a (138, 128) code that satisfies the target message length and has QAEC characteristics. Additionally, in order to design a code that satisfies the 3-bit burst EC, another error burst $b_{(101)}$ needs to be additionally corrected in the TAEC code. The number of error bursts to be corrected is $n_b=4$, and the set of error patterns is defined as shown in Equation 32 below.

$$\varepsilon=\{E_{b_1},E_{b_2},E_{b_3},E_{b_4}\}=\{E_{(1)},E_{(11)},E_{(111)},E_{(101)}\} \qquad \text{<Equation 32>}$$

As in the previous example, it is intended to design a 3-bit burst EC code with a target message length $k_{target}$ of 128. Through Algorithm 3, the minimum length of the parity bit that may have the target message length is m=10, and $g^*(x)=x^{10}+x^9+x^7+x^6+x^5+x^4+x^3+x^2+1$ becomes a generator polynomial. For the burst error group set ε, the syndrome exponent set $V=\{v_1, v_2, v_3, v_4\}$ may be calculated. In this connection, the syndrome exponent for the error pattern is as shown in Equation 33 below.

$$v_1=0, v_2=176, v_3=824, v_5=352 \qquad \text{<Equation 33>}$$

Each syndrome subset $S_i$ is sequentially updated by the size of the burst error pattern set based on the index as shown in Equation 34 below.

$$S_1=\{\alpha^0,\alpha^1,\alpha^2,\ldots,\alpha^{137}\}$$
$$S_2=\{\alpha^{176},\alpha^{177},\alpha^{178},\ldots,\alpha^{312}\}$$
$$S_3=\{\alpha^{824},\alpha^{825},\alpha^{826},\ldots,\alpha^{959}\}$$
$$S_5=\{\alpha^{352},\alpha^{353},\alpha^{354},\ldots,\alpha^{487}\} \qquad \text{<Equation 34>}$$

Accordingly, it is possible to obtain a (138,128) code that satisfies the target message length and has 3-bit burst EC characteristics.

<Code Design Method for AA Burst Error Pattern>

The code design so far has considered the NAA error pattern. For NAA burst error patterns, when a syndrome set $S_i$ for an error burst $b_i$ with length $l_{b_i}$ of error patterns is determined to maintain relative prime with other syndromes, the maximum code length that guarantees error burst b correction is $|S_i|+(l_b-1)$. Accordingly, after the short code is decided, the size of the syndrome set $S_i$ varies according to the burst length. On the other hand, since the AA burst error pattern groups $\overline{E_{b_i}}$ all have the same size, the sizes of $S_i$ of the short codes are all the same. For example, in the case of considering the AA burst error pattern in (138,128) QAEC codes with a target message length of 128, the sizes of the syndrome subsets are all the same as shown in Equation 35 below.

$$|S_1|=|S_2|=|S_3|=|S_4|=138 \qquad \text{<Equation 35>}$$

On the other hand, when the NAA burst error pattern is considered, the size of the syndrome subset is given as shown in Equation 36 below.

$$|S_1|=138, |S_2|=137, |S_3|=136, |S_4|=n_s-l_{b_4}+1=135 \qquad \text{<Equation 36>}$$

The above is a case where the code lengths of the two cases considering the NAA and AA burst error groups are the same. However, since the size of the NAA burst error group is smaller than that of the AA burst error group, the maximum length of the short code may become longer. APPENDIX II presents the code length as a table by distinguishing the case of AA burst error pattern and the case of NAA burst error pattern.

<PCM of Proposed Code>

Using the algorithm presented in the previous section, PCM of DAEC codes, TAEC codes, QAEC codes, and $l_b$-bit burst EC($l_b \leq 8$) codes may be designed. In this section, a generalized model of PCM in which the shortened Hamming code length is $n_s$ is presented. For the defined error pattern, using the generator polynomial g(x) with the maximum short code length $n_{max}$, by conversion into an additive form representation in which the finite field is $F_{2^m}$ and the primitive-element is a, the PCM may be generated as follows. The PCM with the maximum code length of the proposed code is as shown in Equation 37 below.

$$H=[\alpha^0 \alpha^1 \ldots \alpha^{n_{max}-2} \alpha^{n_{max}-1}] \qquad \text{<Equation 37>}$$

In addition, the PCM of a code having a specific target message length $k_{target}$ may be generated as follows using m that satisfies the condition of $n_{target}(=k_{target}+m) \leq n_{max}$. This becomes a code additionally shortened by $n_{max}-n_{target}$ from the code corresponding to the aforementioned H, and the existing error correction performance is maintained. The PCM with the target code length of the proposed code is as shown in Equation 38 below.

$$H=[\alpha^0 \alpha^1 \ldots \alpha^{n_{target}-2} \alpha^{n_{target}-1}] \qquad \text{<Equation 38>}$$

For example, the following presents PCMs of codes that satisfy DAEC and have target message lengths $k_{target}$ of 16, 32, and 64. The lengths of the parity bit are 6, 7, and 8, respectively, and the generator polynomials are $x^6+x^5+x^4+x+1$, $x^7+x^6+x^5+x^4+x^3+x^2+1$, and $x^8+x^6+x^4+x^3+x^2+x+1$, respectively. The PCM of the DAEC (22, 16) proposed code is as shown in Equation 39 below.

$$H = [\alpha^0 \ \alpha^1 \ \ldots \ \alpha^{20} \ \alpha^{21}] = \begin{bmatrix} 1000001101110011000111 \\ 0100001011001010100100 \\ 0010000101100101010010 \\ 0001000010110010101001 \\ 0000101100101010010011 \\ 0000011011100110001110 \end{bmatrix} \qquad \text{<Equation 39>}$$

The PCM of the DAEC (39, 32) proposed code is as shown in Equation 40 below.

$$H = [\alpha^0 \ \alpha^1 \ \ldots \ \alpha^{37} \ \alpha^{38}] = \begin{bmatrix} 100000011001010001110000111110001011011 \\ 010000010101110010010001000010011101110 \\ 001000010011101101010100101011010101100000 \\ 000100001001110110101010010110101100000 \\ 000010011011010101001011101011000011 \\ 000001010111100100100010000100111011010 \\ 000000110010100011100001111100010110110 \end{bmatrix} \qquad \text{<Equation 40>}$$

The PCM of the DAEC (72, 64) proposed code is as shown in Equation 41 below.

$$H = [\alpha^0 \ \alpha^1 \ \ldots \ \alpha^{70} \ \alpha^{71}] = \begin{bmatrix} 100000001010010101010001011101110101110010011101100001011000111110110101010 \\ 010000001111011111110011100110011110010110100110100011101001000001101111 \\ 001000001101111010101101100100010010010111110100001001100010101111000001 \\ 000100001100101000001111011111111001100100111100101101001010001110100 \\ 000010001100000001010010101010001011101110101110010011101100001011000111 \\ 000001000110000000101001010101000101110111010111001001110110000101100011 \\ 000000101001010101000101110111010111001001110110000101100011111101101011 \\ 000000010100101010100010111011101011100100111011000010110001111110110101 \end{bmatrix} \qquad \text{<Equation 41>}$$

Table 6 below shows the code parameters and generator polynomials of each code.

TABLE 6

| | DAEC | | TAEC | | 3bit burst EC | | QAEC | | 4bit burst EC | |
|---|---|---|---|---|---|---|---|---|---|---|
| | parameter | $g(x)_{16}$ | parameter | $g(x)_{16}$ | parameter | $g(x)_{16}$ | parameter | $g(x)_{16}$ | parameter | $g(x)_{16}$ |
| 16 | (22, 16) | 73 | (23, 16) | CB | (23, 16) | 91 | (24, 16) | 18D | (25, 16) | 18D |
| 32 | (39, 32) | F7 | (40, 32) | 15F | (41, 32) | 313 | (41, 32) | 211 | (42, 32) | 56B |
| 64 | (72, 64) | 15F | (73, 64) | 211 | (73, 64) | 313 | (73, 64) | 211 | (75, 64) | F37 |
| 128 | (137, 128) | 33B | (138, 128) | 557 | (138, 128) | 6FD | (138, 128) | 557 | (139, 128) | F37 |

According to such an embodiment of the present disclosure, a code for correcting an error of a semiconductor memory device may be designed as a flexible and low-complexity code for various message lengths. These codes may be used as error correction codes that correct burst errors that frequently occur in memory cells, and may be designed as correctable codes for specific error patterns as well as adjacent error patterns. Even when an error correction code is designed using a neural network in the future, the design of a burst error correction code using the characteristics of a cyclic code according to an embodiment of the present disclosure may be applied.

TABLE 8

| $g(x)_{16}$ | primitive polynomial | $v_2$ | $v_3$ | $v_4$ | $v_5$ |
|---|---|---|---|---|---|
| 43 | $x^6 + x + 1$ | 6 | 26 | 18 | 12 |
| 5B | $x^6 + x^3 + x + 1$ | 56 | 20 | 42 | 49 |
| 61 | $x^6 + x^5 + 1$ | 58 | 39 | 48 | 53 |
| 67 | $x^6 + x^5 + x^2 + x + 1$ | 25 | 30 | 12 | 50 |
| 6D | $x^6 + x^5 + x^3 + x^2 + 1$ | 8 | 45 | 24 | 16 |
| 73 | $x^6 + x^5 + x^4 + x + 1$ | 39 | 35 | 54 | 15 |

Example of Maximum Code/Minimum Length of Parity Bit of Multiple Error Patterns of Invented Technology (Table)

1. Maximum Short Code Length $n_{max}$ per AA/NAA Burst Error Pattern

TABLE 9

| | SEC-DAEC | | SEC-TAEC | | 3bit burst EC | | SEC-QAEC | | 4bit burst EC | |
|---|---|---|---|---|---|---|---|---|---|---|
| m | AA | NAA | AA | NAA | AA | NAA | AA | NAA | AA | NAA |
| 6 | 25 | 25 | 8 | 8 | 8 | 8 | 8 | 8 | | |
| 7 | 55 | 55 | 31 | 32 | 26 | 26 | 13 | 13 | | |
| 8 | 122 | 122 | 59 | 60 | 31 | 33 | 28 | 30 | 15 | 18 |
| 9 | 249 | 249 | 130 | 130 | 114 | 114 | 100 | 102 | 35 | 38 |
| 10 | 493 | 493 | 277 | 277 | 176 | 176 | 195 | 195 | 69 | 71 |
| 11 | 1019 | 1019 | 600 | 600 | 412 | 412 | 430 | 431 | 139 | 142 |
| 12 | 2033 | 2033 | 1256 | 1257 | 940 | 940 | 740 | 742 | 346 | 347 |

Examples of Indices for Error Patterns of Invented Technology (Table)

1. When the index for the error pattern of the generator polynomial is selected within the range of m=5, examples of indices $v_2$, $v_3$, $v_4$, $v_5$ corresponding to the error patterns ($e_2$=(11000), $e_3$=(11100), $e_4$=(11110), $e_5$=(10100)) of DAEC, TAEC, QAEC, and 3-bit burst EC, respectively, are shown in Table 7 below.

TABLE 7

| $g(x)_{16}$ | primitive polynomial | $v_2$ | $v_3$ | $v_4$ | $v_5$ |
|---|---|---|---|---|---|
| 25 | $x^5 + x^2 + 1$ | 18 | 11 | 23 | 5 |
| 29 | $x^5 + x^3 + 1$ | 14 | 22 | 11 | 28 |
| 2F | $x^5 + x^3 + x^2 + x + 1$ | 12 | 27 | 5 | 24 |
| 37 | $x^5 + x^4 + x^2 + x + 1$ | 19 | 23 | 26 | 7 |
| 3B | $x^5 + x^4 + x^3 + x + 1$ | 13 | 10 | 8 | 26 |
| 3D | $x^5 + x^4 + x^3 + x^2 + 1$ | 20 | 6 | 29 | 9 |

2. When the index for the error pattern of the generator polynomial is selected within the range of m=6, examples of indices $v_2$, $v_3$, $v_4$, $v_5$ corresponding to the error patterns ($e_2$=(110000), $e_3$=(111000), $e_4$=(111100), $e_5$=(101000)) of DAEC, TAEC, QAEC, and 3-bit burst EC, respectively, are shown below.

2. Optimal Generator Polynomial and Maximum Short Code Length for Each Length of Parity Bit of Invented Code

TABLE 10

| | SEC-DAEC | | SEC-TAEC | | 3bit burst EC | | SEC-QAEC | |
|---|---|---|---|---|---|---|---|---|
| m | $g(x)_{16}$ | len | $g(x)_{16}$ | len | $g(x)_{16}$ | len | $g(x)_{16}$ | len |
| 6 | 67 | 25 | 5B | 8 | 5B | 8 | 5B | 8 |
| | 73 | | 6D | | 6D | | 6D | |
| 7 | EF | 55 | CB | 32 | 89 | 26 | 89 | 13 |
| | F7 | | D3 | | 91 | | 91 | |
| | | | | | | | CB | |
| | | | | | | | D3 | |
| 8 | 1F5 | 122 | 15F | 60 | 163 | 33 | 163 | 30 |
| | 15F | | 1F5 | | 18D | | 18D | |
| 9 | 33B | 249 | 211 | 130 | 313 | 114 | 211 | 102 |
| | 373 | | 221 | | 323 | | 221 | |
| 10 | 41B | 493 | 557 | 277 | 5FB | 176 | 557 | 195 |
| | 6C1 | | 755 | | 6FD | | 755 | |
| 11 | 805 | 1019 | 865 | 600 | BDB | 412 | AFB | 431 |
| | A01 | | A61 | | DBD | | DF5 | |
| 12 | 10EB | 2033 | 15D7 | 1257 | 191B | 940 | 17B3 | 742 |
| | 1AE1 | | 1D75 | | 1B13 | | 19BD | |

TABLE 11

| | 4bit burst EC | | 5bit burst EC | | 6bit burst EC | | 7bit burst EC | | 8bit burst EC | |
|---|---|---|---|---|---|---|---|---|---|---|
| m | $g(x)_{16}$ | $n_{max}$ | $g(x)_{16}$ | $n_{max}$ | $g(x)_{16}$ | $n_{max}$ | $g(x)_{16}$ | $n_{max}$ | $g(x)_{16}$ | $n_{max}$ |
| 9 | 259 269 | 38 | | | | | | | | |
| 10 | 56B 6B5 | 71 | 523 625 | 27 | | | | | | |
| 11 | ECF F37 | 142 | B65 A6D | 40 | | | | | | |
| 12 | 1A1B 1B0B | 346 | 1BBF 1FBB | 103 | 197B 1BD3 | 28 | | | | |
| 13 | 3997 3A67 | 726 | 290F 3C25 | 263 | 25C5 28E9 | 53 | | | | |
| 14 | 512D 5A45 | 1585 | 7E7F 7F3F | 465 | 69AB 6ACB | 134 | 47A7 72F1 | 31 | | |
| 15 | C1E7 E783 | 3483 | BF8B D1FD | 1186 | 8C55 AA31 | 281 | CEF3 CF73 | 65 | | |
| 16 | 1739B 1B39D | 6074 | 144BB 1BA45 | 1816 | 13C47 1C479 | 525 | 15D07 1C175 | 142 | 13107 1C119 165E7 1CF4D | 33 |
| 17 | 3082B 35043 | 14057 | 2F063 3183D | 4377 | 2493B 37249 | 1305 | 24AE9 25D49 | 403 | 25F1D 2E3E9 | 76 |
| 18 | 5252B 6A525 | 28094 | 54C53 65195 | 8050 | 42B27 726A1 | 2275 | 44FC7 71F91 | 639 | 6F46F 7B17B | 179 |

3. Length of Parity Bit for Each Message Length of Invented Code

TABLE 12

| $k_{target}$ | SEC-DAEC | SEC-TAEC | 3bit burst EC | SEC-QAEC | 4bit burst EC | 5bit burst EC | 6bit burst EC | 7bit burst EC |
|---|---|---|---|---|---|---|---|---|
| 16 | 6 | 7 | 7 | 8 | 9 | 10 | 12 | 14 |
| 32 | 7 | 8 | 9 | 9 | 10 | 12 | 13 | 15 |
| 48 | 7 | 8 | 9 | 9 | 10 | 12 | 14 | 15 |
| 64 | 8 | 9 | 9 | 9 | 11 | 12 | 14 | 16 |
| 80 | 8 | 9 | 9 | 9 | 11 | 12 | 14 | 16 |
| 96 | 8 | 9 | 9 | 10 | 11 | 13 | 14 | 16 |
| 112 | 8 | 9 | 10 | 10 | 11 | 13 | 14 | 16 |
| 128 | 9 | 10 | 10 | 10 | 11 | 13 | 15 | 17 |
| 144 | 9 | 10 | 10 | 10 | 12 | 13 | 15 | 17 |
| 160 | 9 | 10 | 10 | 10 | 12 | 13 | 15 | 17 |
| 176 | 9 | 10 | 11 | 10 | 12 | 13 | 15 | 17 |
| 192 | 9 | 10 | 11 | 11 | 12 | 13 | 15 | 17 |
| 208 | 9 | 10 | 11 | 11 | 12 | 13 | 15 | 17 |
| 224 | 9 | 10 | 11 | 11 | 12 | 13 | 15 | 17 |
| 240 | 9 | 10 | 11 | 11 | 12 | 13 | 15 | 17 |
| 256 | 10 | 10 | 11 | 11 | 12 | 14 | 15 | 17 |
| 272 | 10 | 11 | 11 | 11 | 12 | 14 | 16 | 17 |
| 288 | 10 | 11 | 11 | 11 | 12 | 14 | 16 | 17 |
| 304 | 10 | 11 | 11 | 11 | 12 | 14 | 16 | 17 |
| 320 | 10 | 11 | 11 | 11 | 12 | 14 | 16 | 17 |
| 336 | 10 | 11 | 11 | 11 | 13 | 14 | 16 | 17 |
| 352 | 10 | 11 | 11 | 11 | 13 | 14 | 16 | 17 |
| 368 | 10 | 11 | 11 | 11 | 13 | 14 | 16 | 17 |
| 384 | 10 | 11 | 11 | 11 | 13 | 14 | 16 | 17 |
| 400 | 10 | 11 | 11 | 11 | 13 | 14 | 16 | 18 |
| 416 | 10 | 11 | 12 | 11 | 13 | 14 | 16 | 18 |
| 432 | 10 | 11 | 12 | 12 | 13 | 14 | 16 | 18 |
| 448 | 10 | 11 | 12 | 12 | 13 | 14 | 16 | 18 |
| 464 | 10 | 11 | 12 | 12 | 13 | 15 | 16 | 18 |
| 480 | 10 | 11 | 12 | 12 | 13 | 15 | 16 | 18 |
| 496 | 11 | 11 | 12 | 12 | 13 | 15 | 16 | 18 |
| 512 | 11 | 11 | 12 | 12 | 13 | 15 | 17 | 18 |

Figure 5:
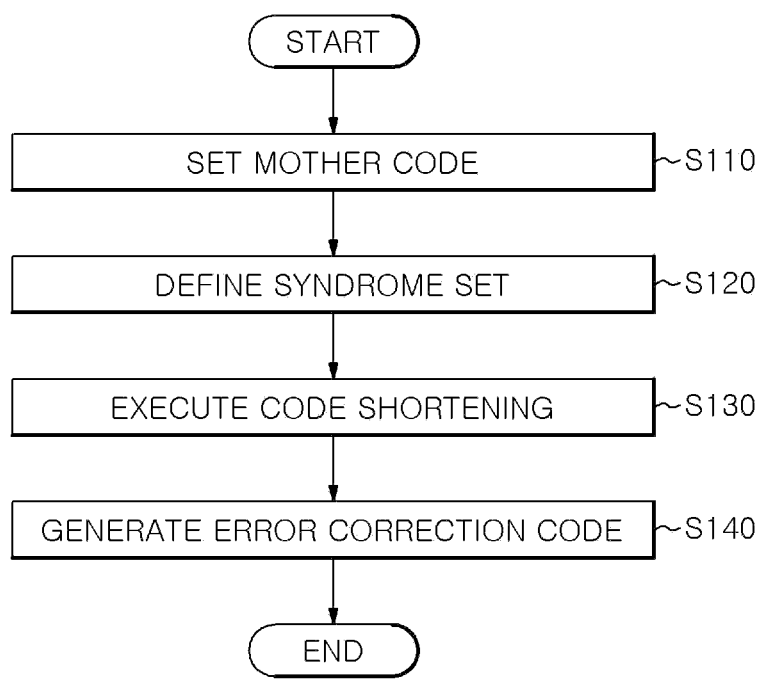
FIG. 5 is a flowchart illustrating a method for generating a burst error correction code according to an embodiment of the present disclosure.
Figure 6:
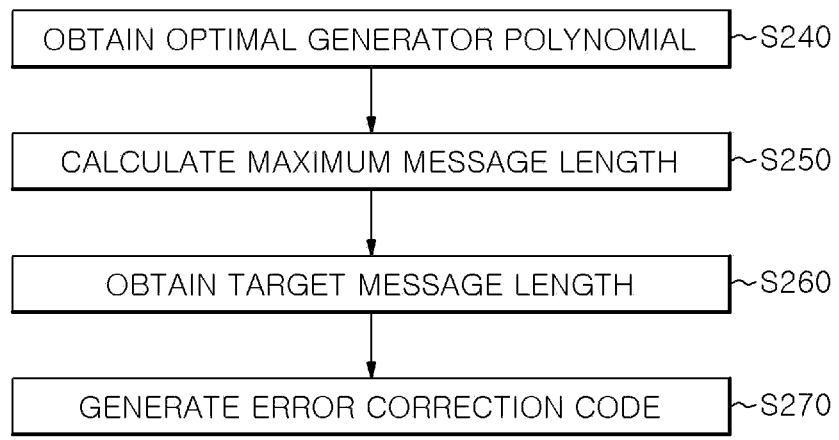
FIG. 6 is a flowchart illustrating a method for generating a burst error correction code according to another embodiment of the present disclosure.

To sum up the aforementioned contents, a method for generating a burst error correction code according to an embodiment of the present disclosure will be described with reference to the flowcharts of FIGS. 5 and 6. The method for generating the burst error correction code according to an embodiment of the present disclosure may be performed in substantially the same configuration as the aforementioned configuration.

The method for generating the burst error correction code according to an embodiment of the present disclosure includes: setting a mother code (S110); defining a syndrome set corresponding to each burst error pattern for at least two burst error patterns to be corrected based on the mother code (S120); executing code shortening that shortens a column of a parity check matrix (PCM) of the mother code so that the defined syndrome sets are relatively prime (S130); and generating an error correction code for the each burst error pattern based on a syndrome vector included in the syndrome set (S140).

Herein, the at least two burst error patterns may be at least two of a single bit error and a Q bit adjacent error (Q is a natural number).

In S130, a message length of the mother code may be reduced by a predetermined length ($l_s$).

Herein, the mother code is provided with a Hamming code using an attribute of a cyclic code, the Hamming code has a generator polynomial g(x) obtained based on a primitive polynomial of a Galois field, and when the length of the parity bit is m, a field is the Galois field $GF(2^m)$.

Specifically, S130 may include: obtaining a maximum short code length $n_{max}$ of a short code (hereinafter, equal to a maximum code length) satisfying a condition that the syndrome sets do not overlap by gradually selecting a column of the PCM of the mother code; and obtaining a maximum message length $k_{max}$ by subtracting the length of the parity bit m from the maximum short code length $n_{max}$.

Herein, in order to obtain a code capable of correcting all the burst error patterns, a minimum value of the maximum code length $n_j$ may be decided as a maximum short code length $n_{max}$.

In addition, the obtaining of the maximum length of the short code may be a method of selecting columns in order from a leftmost column of the mother code and stopping before overlap between the syndrome sets occurs.

In an embodiment, the obtaining of the maximum length of the short code is configured such that: after sorting syndrome exponents, which are starting points of the syndrome set, in ascending order, so that the syndrome sets correcting the each burst error pattern do not overlap, the maximum short code length $n_{max}$ that allows the burst error pattern to be corrected is calculated by setting such that the syndrome sets do not overlap, using a difference between values of the syndrome exponents.

In addition, the obtaining of the maximum length of the short code is configured to obtain an optimal generator polynomial g*(x) maximizing a maximum shortened length based on the generator polynomial g(x) within a range of the length of the parity bit m.

Herein, in the obtaining of the optimal generator polynomial g*(x) (S240), when the generator polynomial g(x) is expressed in hexadecimal by the length of the parity bit m, a range capable of being used as the generator polynomial is as shown in Equation 42.

$$2^m+1<[g(x)]<2^{m+1} \qquad \text{<Equation 42>}$$

A maximum value of the maximum short code length $n_{max}$ of a code generated by the generator polynomial within the range is defined as $n^*_{max}$, and the generator polynomial for generating the code having a maximum value $n^*_{max}$ of the maximum message length is set to the optimal generator polynomial g*(x).

Thereafter, there may be included: obtaining a maximum message length $k_{max}$ by subtracting the length of the parity bit m from the maximum short code length $n_{max}$ (S250); calculating a target message length $k_{target}$ by subtracting the length of the parity bit m from a target code length $n_{target}$ shortened by a shortened length $l_s$ bit (S260); and generating an error correction code that satisfies the target message length $k_{target}$ based on the optimal generator polynomial g*(x) (S270).

Figure 7:
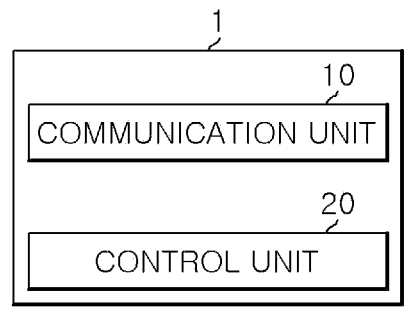
FIG. 7 is a block diagram illustrating a device for generating a burst error correction code according to an embodiment of the present disclosure.

A device 1 for generating a burst error correction code according to another embodiment of the present disclosure includes a communication unit 10 and a control unit 20 as illustrated in FIG. 7. For a detailed description of each configuration, reference is made to the description of the method for generating the burst error correction code.

The communication unit 10 serves to communicate with a memory for correcting errors in the control unit 20.

The control unit 20 sets a mother code for correcting errors in the memory, defines a syndrome set of each burst error pattern for at least two burst error patterns to be corrected based on the mother code, shortens a column of a parity check matrix PCM of the mother code so that the defined syndrome sets are relatively prime, obtains an optimal generator polynomial g*(x) maximizing a length of the shortened code within the range of a length of the parity bit (m) of the mother code, obtains a maximum message length $k_{max}$ by subtracting the length of the parity bit m from the maximum short code length $n_{max}$, obtains a target message length $k_{target}$ by subtracting the length of the parity bit m from a target code length $n_{target}$ shortened by a shortened length $l_s$ bit, and generates an error correction code that satisfies the target message length $k_{target}$ based on the optimal generator polynomial g*(x).

Combinations of steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each step of the flowchart. The computer program instructions can also be stored on a computer-usable or computer-readable storage medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each step of the flowchart. In addition, each step may represent a module, a segment, or a portion of codes which contains one or more executable instructions for executing the specified logical function(s). It should also be noted that in some alternative embodiments, the functions mentioned in the steps may occur out of order. For example, two steps illustrated in succession may in fact be performed substantially simultaneously, or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A method for generating a burst error correction code, the method comprising:
   controlling a control unit to set a mother code in a memory, wherein the mother code corresponds to a PCM (parity check matrix) and is provided with a Hamming code using an attribute of a cyclic code;
   controlling the control unit to determine different syndrome sets corresponding to each burst error pattern for at least two burst error patterns to be corrected based on the mother code;
   controlling the control unit to shorten the mother code by shortening a column of the PCM of the mother code so that the defined syndrome sets are disjoint sets, wherein the PCM discriminates whether a vector to be checked is a codeword; and
   controlling the control unit to generate the burst error correction code for each burst error pattern based on an optimal generator polynomial providing a longest code length within a range of a length of a parity of the mother code or a syndrome vector included in the syndrome sets that are disjoint sets.

2. The method of claim 1, wherein the at least two burst error patterns are at least two of a single bit error and a Q bit adjacent error (Q is a natural number).

3. The method of claim 1, wherein the shortening the code includes reducing a message length of the mother code by a predetermined length.

4. The method of claim 1, wherein:
the Hamming code has a generator polynomial obtained based on a primitive polynomial of a Galois field, and when the length of the parity is m, a field is the Galois field.

5. The method of claim 4, wherein the shortening the code includes:
determining a longest code length of a short code satisfying a condition that the syndrome sets do not overlap by gradually selecting the column of the PCM of the mother code; and
determining a longest message length by subtracting the length of the parity from the longest code length.

6. The method of claim 5, wherein in order to obtain a code capable of correcting all the burst error patterns, a minimum value of the longest code length is decided as a longest short code length.

7. The method of claim 5, wherein the determining of the longest code length is configured to select columns in order from a leftmost column of the mother code and stop before overlap between the syndrome sets occurs.

8. The method of claim 5, wherein the determining the longest code length includes:
sorting syndrome exponents, which are starting points of the syndrome sets, in ascending order, and then setting the syndrome sets not being overlapped the syndrome exponents in the syndrome sets using a difference between values of the syndrome exponents, and
calculating the longest code length that allows the burst error pattern to be corrected.

9. The method of claim 5, wherein the determining the longest code length includes determining an optimal generator polynomial maximizing a longest shortened length based on the generator polynomial within a range of the length m of the parity.

10. The method of claim 9, wherein the determining the optimal generator polynomial, when the generator polynomial is converted and expressed in hexadecimal by the length of the parity m, a range capable of being used as the generator polynomial is as shown in Equation 1 below:

$$2^m+1<[g(x)]<2^{m+1}$$  <Equation 1> wherein a longest value of the longest code length of a code generated by the generator polynomial within the range is defined, and the generator polynomial for generating the code having a longest value of the longest message length is set to the optimal generator polynomial, wherein g(x) indicates the generator polynomial, [g(x)] indicates the range capable of being used as the generator polynomial, and m indicates the length of the parity.

11. The method of claim 1, wherein the designing of the burst error correction code for the each burst error pattern includes:
determining the optimal generator polynomial maximizing the length of the code to be shortened by shortening a column of the PCM within the range of the length of the parity of the mother code;
calculating a longest message length by subtracting the length of the parity from a longest code length of the code to be shortened by shortening a column of the PCM;
determining a target message length by subtracting the length of the parity from a target code length shortened by a shortened length bit; and
designing the burst error correction code that satisfies the target message length based on the optimal generator polynomial.

12. The method of claim 11, wherein the shortening the code includes:
determining a longest code length of a short code satisfying a condition that the syndrome sets do not overlap by gradually selecting a column of the PCM of the mother code; and
determining a longest message length by subtracting the length of the parity from the longest code length.

13. The method of claim 12, wherein the determining the longest code length is configured to determine the optimal generator polynomial maximizing a longest shortened length based on the generator polynomial.

14. The method of claim 13, wherein in the determining the optimal generator polynomial, when the generator polynomial is expressed in hexadecimal by the length of the parity m, a range capable of being used as the generator polynomial is as shown in Equation 2 below:

$$2^{m+1}<[g(x)]<2^{m+1}$$  <Equation 2> wherein a longest value of the longest code length of a code generated by the generator polynomial within the range is defined, and the generator polynomial for generating the code having a longest value of the longest message length is set to the optimal generator polynomial, wherein g(x) indicates the generator polynomial, [g(x)] indicates the range capable of being used as the generator polynomial, and m indicates the length of the parity.

15. A device for generating a burst error correction code, the device comprising:
a memory;
a communication unit configured to communicate with the memory; and
a control unit configured to:
set a mother code, wherein the mother code corresponds to a PCM (parity check matrix) and is provided with a Hamming code using an attribute of a cyclic code, for correcting errors in the memory,
determine different syndrome sets corresponding to each burst error pattern for at least two burst error patterns to be corrected based on the mother code,
shorten the mother code by shortening a column of the PCM of the mother code so that the defined syndrome sets are disjoint sets, wherein the PCM discriminates whether a vector to be checked is a codeword, and
generate the burst error correction code for the each burst error pattern based on an optimal generator polynomial providing a longest code length within a range of a length of a parity of the mother code or a syndrome vector included in the syndrome sets that are disjoint sets.

16. The device of claim 15, wherein the control unit is configured to reduce a message length of the mother code by a predetermined length Is in order to shorten the column of the PCM.

17. The device of claim 15, wherein the mother code is provided with a Hamming code using an attribute of a cyclic code; and
the Hamming code has a generator polynomial obtained based on a primitive polynomial of a Galois field, and when the length of the parity is m, a field is the Galois field.

18. The device of claim 15, wherein the control unit is configured to:
- determine the optimal generator polynomial maximizing the length of the code to be shortened by shortening a column of the PCM within the range of the length of the parity of the mother code;
- calculate a longest message length by subtracting the length of the parity from a longest code length of the code to be shortened by shortening a column of the PCM;
- determine a target message length by subtracting the length of the parity from a target code length shortened by a shortened length bit; and
- design the burst error correction code that satisfies the target message length based on the optimal generator polynomial.

19. A non-transitory computer-readable storage medium including computer executable instructions, wherein the instructions, when executed by a processor, cause the processor to perform a method for generating a burst error correction code, the method comprising:
- controlling a control unit to set a mother code in a memory, wherein the mother code corresponds to a PCM (parity check matrix) and is provided with a Hamming code using an attribute of a cyclic code;
- controlling the control unit to determine different syndrome sets corresponding to each burst error pattern for at least two burst error patterns to be corrected based on the mother code;
- control the control unit to shorten the mother code by shortening a column of the PCM of the mother code so that the defined syndrome sets are disjoint sets, wherein the PCM discriminates whether a vector to be checked is a codeword; and
- control the control unit to generate the burst error correction code for the each burst error pattern based on an optimal generator polynomial providing a longest code length within a range of a length of a parity of the mother code or a syndrome vector included in the syndrome sets that are disjoint sets.

20. The non-transitory computer-readable storage medium of claim 19, wherein the designing of the burst error correction code for the each burst error pattern includes:
- determining the optimal generator polynomial maximizing the length of the code to be shortened by shortening a column of the PCM within the range of the length of the parity of the mother code;
- calculating a longest message length by subtracting the length of the parity from a longest code length of the code to be shortened by shortening a column of the PCM;
- determining a target message length by subtracting the length of the parity from a target code length shortened by a shortened length bit; and
- generating the burst error correction code that satisfies the target message length based on the optimal generator polynomial.

* * * * *